(12) United States Patent
Lee et al.

(10) Patent No.: US 10,202,276 B2
(45) Date of Patent: Feb. 12, 2019

(54) METHOD FOR MANUFACTURING MICROCANTILEVER

(71) Applicant: INDUSTRY-UNIVERSITY COOPERATION FOUNDATION SOGANG UNIVERSITY, Seoul (KR)

(72) Inventors: Jung Chul Lee, Seoul (KR); Il Lee, Gyeongsangnam-do (KR)

(73) Assignee: INDUSTRY-UNIVERSITY COOPERATION FOUNDATION SOGANG UNIVERSITY, Seoul (KR)

( * ) Notice: Subject to any disclaimer, the term of this patent is extended or adjusted under 35 U.S.C. 154(b) by 248 days.

(21) Appl. No.: 15/033,069

(22) PCT Filed: Nov. 19, 2013

(86) PCT No.: PCT/KR2013/010515
§ 371 (c)(1),
(2) Date: Apr. 28, 2016

(87) PCT Pub. No.: WO2015/064816
PCT Pub. Date: May 7, 2015

(65) Prior Publication Data
US 2016/0236929 A1 Aug. 18, 2016

(30) Foreign Application Priority Data
Oct. 29, 2013 (KR) ........................ 10-2013-0129551

(51) Int. Cl.
*G01Q 70/16* (2010.01)
*B81C 1/00* (2006.01)
(Continued)

(52) U.S. Cl.
CPC .......... *B81C 1/0015* (2013.01); *B81B 3/0021* (2013.01); *B81C 99/0025* (2013.01);
(Continued)

(58) Field of Classification Search
CPC . B81C 1/0015; B81C 99/0025; B81B 3/0021; G01D 11/30; G01Q 70/14;
(Continued)

(56) References Cited

U.S. PATENT DOCUMENTS 5,015,424 A 5/1991 Smalley
6,562,278 B1 5/2003 Farnworth et al.
2005/0169962 A1 8/2005 Bhatia et al.

FOREIGN PATENT DOCUMENTS

JP 2003315242 11/2003

OTHER PUBLICATIONS

Extended European Search Report for European Patent Application No. 13896608.0 dated May 22, 2017.
(Continued)

*Primary Examiner* — Robert R Raevis
(74) *Attorney, Agent, or Firm* — Kunzler, PC

(57) ABSTRACT

Disclosed is a method for manufacturing a microcantilever having a predetermined thickness that includes forming a liquid synthetic resin for cantilevers to a thickness corresponding to the thickness of the microcantilever on an upper surface of a base block having an adhesive base and a non-adhesive base, and curing the liquid synthetic resin for cantilevers via a boundary between the adhesive base and the non-adhesive base, wherein the adhesive base has stronger adhesivity to the cured synthetic resin for cantilevers than the non-adhesive base.

21 Claims, 6 Drawing Sheets

(51) Int. Cl.
    *B81B 3/00*     (2006.01)
    *B81C 99/00*     (2010.01)
    *G01D 11/30*     (2006.01)
    *G01Q 70/14*     (2010.01)
    *B33Y 10/00*     (2015.01)
    *B33Y 30/00*     (2015.01)
    *B33Y 80/00*     (2015.01)
    *B29C 35/08*     (2006.01)
    *B29K 71/00*     (2006.01)
    *B29K 105/00*     (2006.01)
    *B29L 31/00*     (2006.01)
    *B29C 64/135*     (2017.01)

(52) U.S. Cl.
    CPC .......... *G01D 11/30* (2013.01); *B29C 35/0805* (2013.01); *B29C 64/135* (2017.08); *B29C 2035/0827* (2013.01); *B29K 2071/02* (2013.01); *B29K 2105/0061* (2013.01); *B29K 2995/0027* (2013.01); *B29L 2031/756* (2013.01); *B33Y 10/00* (2014.12); *B33Y 30/00* (2014.12); *B33Y 80/00* (2014.12); *B81B 2201/12* (2013.01); *B81B 2203/0118* (2013.01); *B81C 2201/0188* (2013.01); *B81C 2201/034* (2013.01); *B81C 2203/038* (2013.01); *G01Q 70/14* (2013.01); *G01Q 70/16* (2013.01)

(58) Field of Classification Search
    CPC ........ G01Q 70/16; B33Y 10/00; B33Y 30/00; B33Y 80/00; B29C 35/0805; B29C 2035/0827; B29K 2071/02; B29K 2105/0061; B29K 2995/0027
    USPC ..... 73/866.5, 104, 105, 31.05, 31.03, 31.01, 73/23.2, 53.01, 61.41, 61.43, 61.49, 73/61.79, 64.73, 61.4, 3; 436/183, 184; 850/33; 438/694; 250/306, 307
    See application file for complete search history.

(56) References Cited

OTHER PUBLICATIONS

Chung et al., In Situ Fabrication and Actuation of Polymer Magnetic Microstructures, Journal of Microelectromechanical Systems, Aug. 2011, pp. 785-787, vol. 20, No. 4.

Chan et al., "Multi-material bio-fabrication of hydrogel cantilevers and actuators with stereolithography", pp. 88-98, accessed from http://libna.mntl.illinois.edu/pdf/publications/133_chan.pdf on Apr. 28, 2016.

International Search Report for International Application No. PCT/KR2013/010515 dated Jul. 18, 2014.

[Fig. 1]
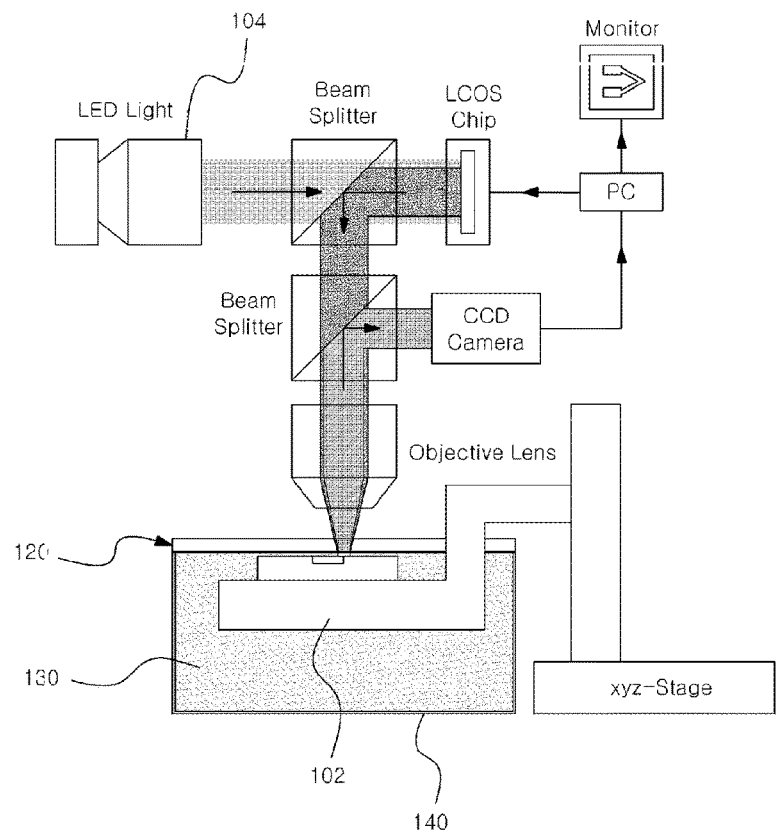
[Fig. 2]
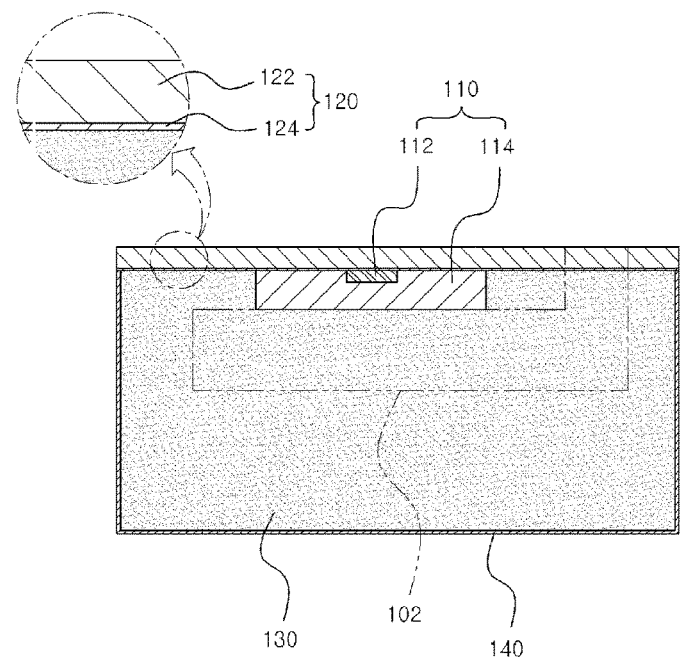

[Fig. 3]
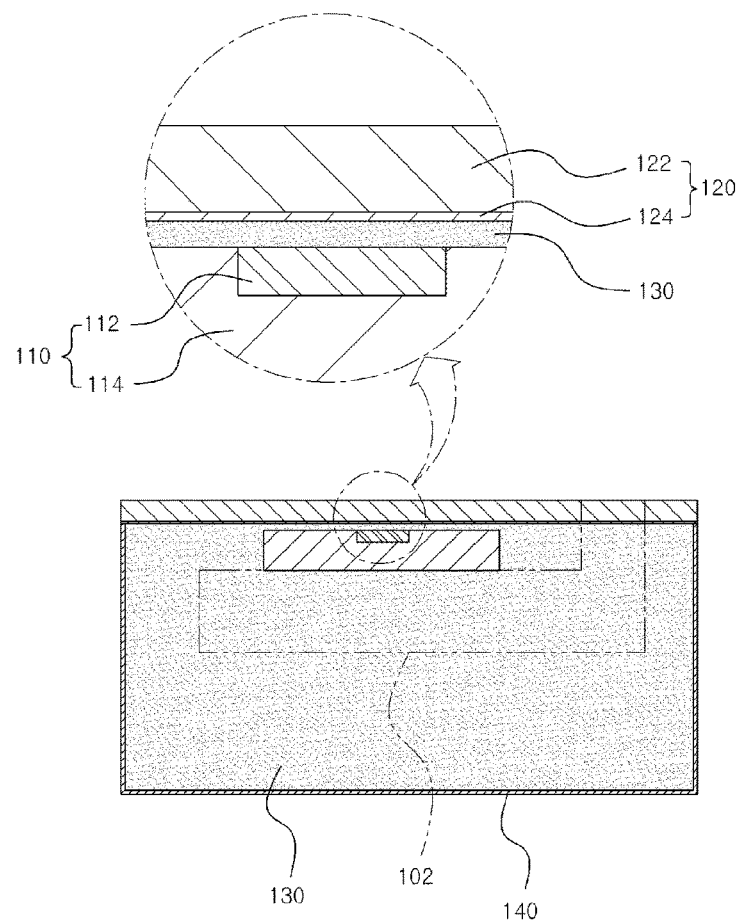
[Fig. 4]
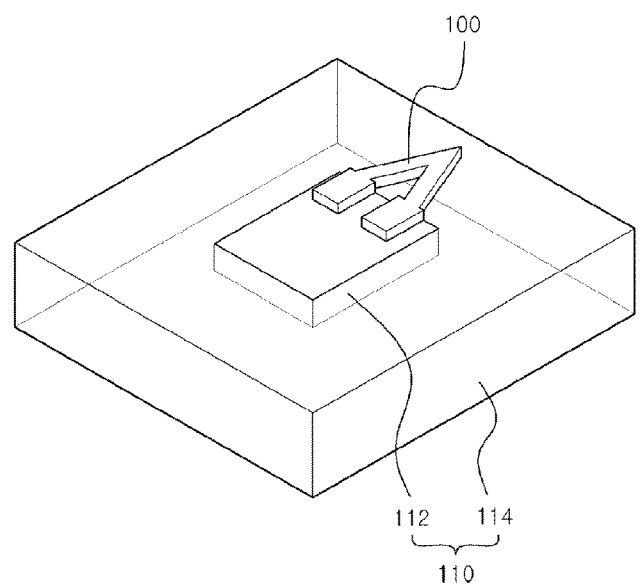

[Fig. 5]
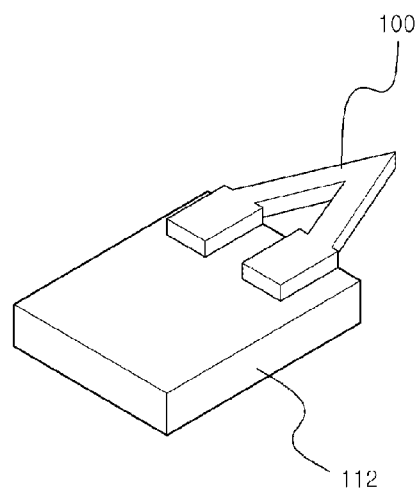
[Fig. 6]
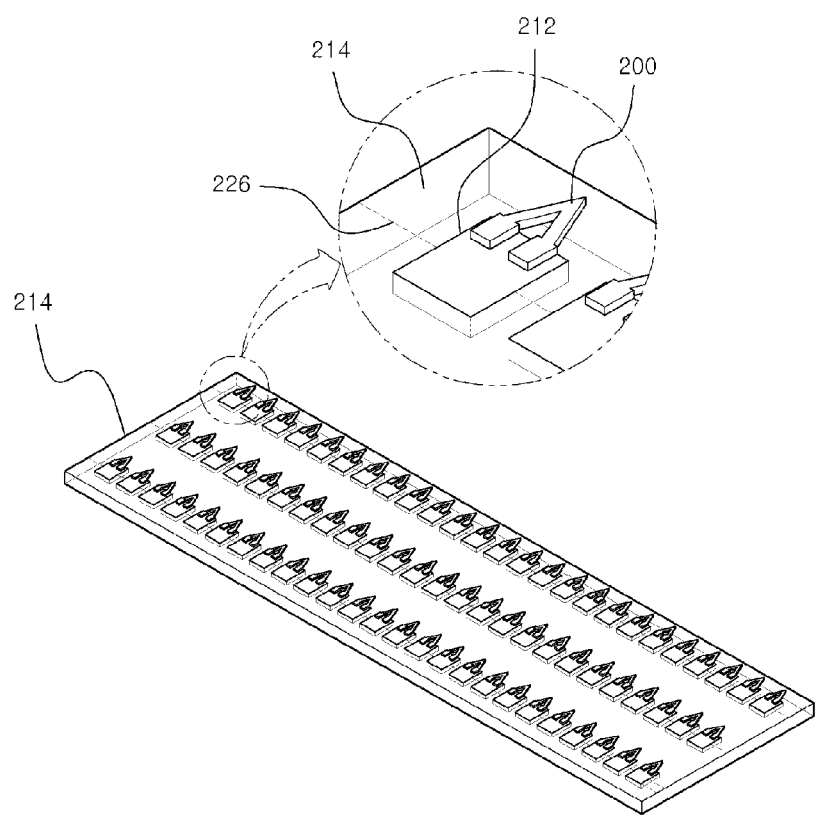

[Fig. 7]
(a)
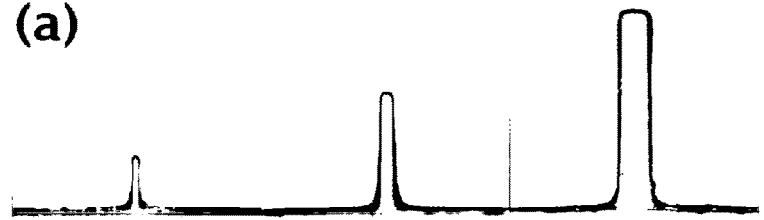
(b)
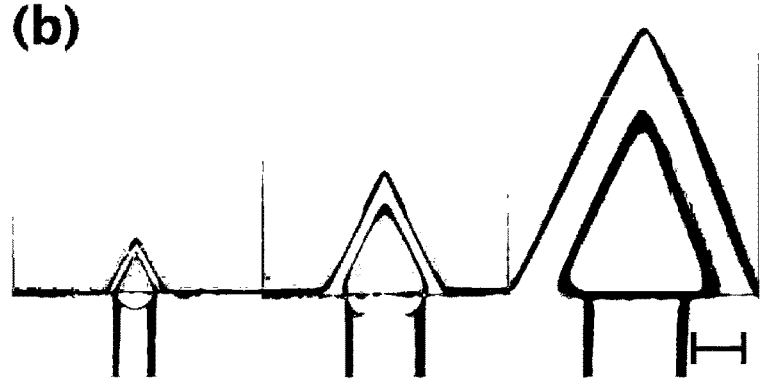
[Fig. 8]
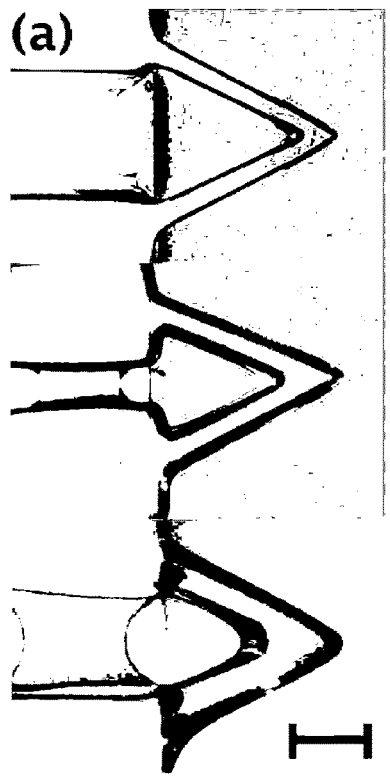

[Fig. 9]
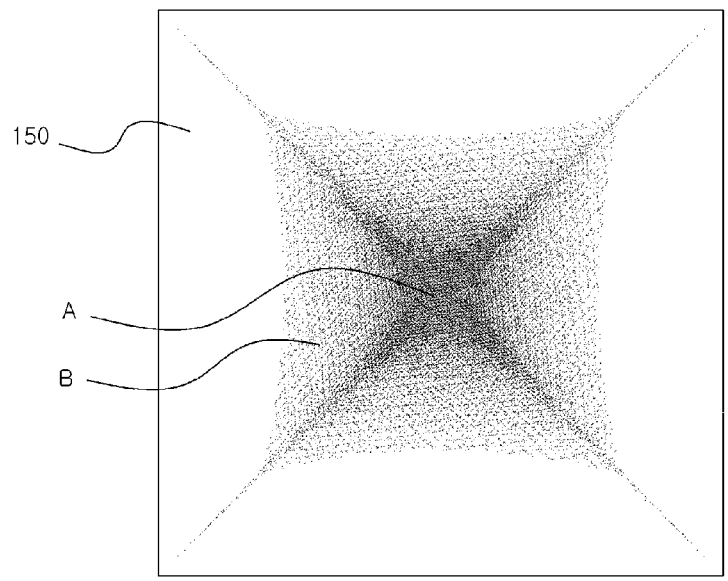
[Fig. 10]
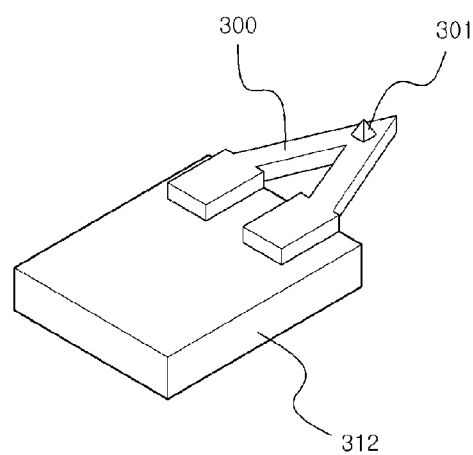

[Fig. 11]
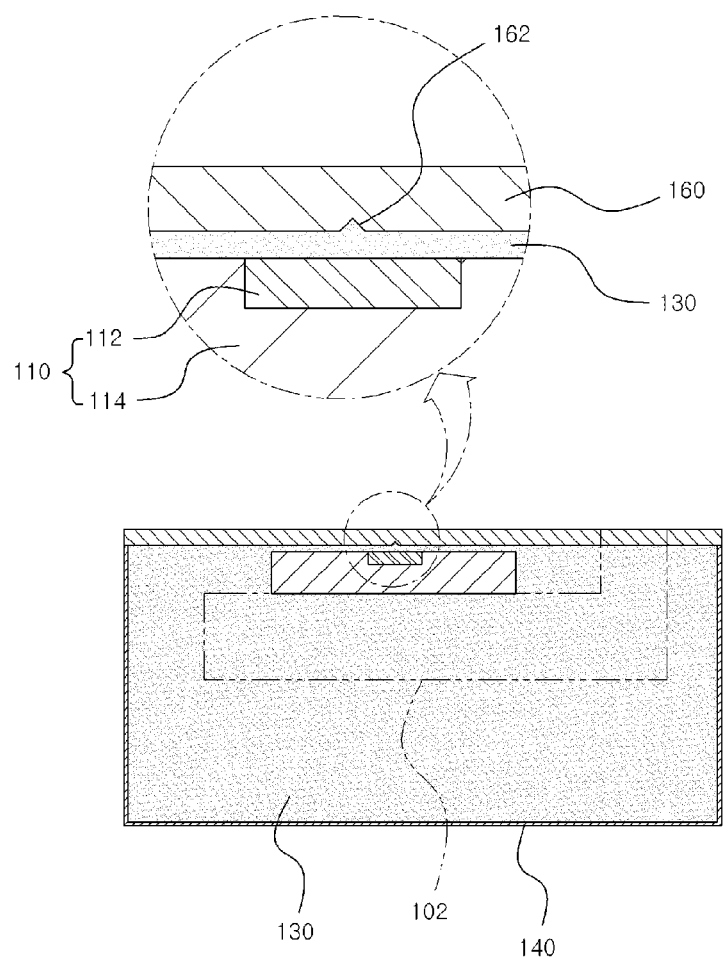

METHOD FOR MANUFACTURING MICROCANTILEVER

TECHNICAL FIELD

The present invention relates to a method for manufacturing a microcantilever, and more particularly to a method for manufacturing a thinner and more accurate microcantilever with a soft material.

BACKGROUND ART

In general, microcantilever sensors are made of hard materials such as silicon, silicon nitride or silicon oxide. Accordingly, microcantilever sensors have a difficulty of response to weak stress or force and a limited applicability as sensitive sensors. In addition, it is very important to directly synthesize microcantilevers from soft and sensitive materials in order to use the same as certain biological/chemical sensors. One of effective materials in consideration of manufacturing possibility, stimuli-response and biocompatability is hydrogel.

Hydrogel microcantilevers were first synthesized by Toshiyuki Watanabe using two-proton polymerization reaction. In accordance with Watanabe's research, "Photoresponsive hydrogel microstructure fabricated by two-photon initiated polymerization", found in Advanced Functional Materials of Wiley-VCH, in 2002, the attempt was encouraging, but there were problems in that synthesized microcantilevers had an extremely irregular thickness and process time was long.

Recently, flat hydrogel microcantilevers have been synthesized with three-dimensional stereolithography using focal lasers. These fine hydrogel microcantilevers can be synthesized to a length of 2 mm, a width of 2 mm and a thickness of 450 µm. Obviously, the length and width can be decreased as focus range of the laser becomes smaller. However, reduction in thickness of hydrogel microcantilevers remains unsolved due to limited permeation of lasers into hydrogels.

DISCLOSURE

Technical Problem

Therefore, it is one object of the present invention to solve the problem of conventional microcantilevers in that they respond only to limited force because they are made of a hard material such as silicon, and to provide a method for manufacturing a microcantilever with a soft material in order to use the microcantilever as a variety of sensors.

It is another object of the present invention to provide a method for manufacturing a microcantilever with an accurate shape.

It is another object of the present invention to provide a method for manufacturing a thinner microcantilever.

It is another object of the present invention to provide a method for manufacturing a microcantilever having a flat outer surface.

It is yet another object of the present invention to provide a method for manufacturing a microcantilever advantageous for mass-production.

Technical Solution

In accordance with an aspect of the present invention, the above and other objects can be accomplished by the provision of a method for manufacturing a microcantilever having a predetermined thickness including providing a base block having an adhesive base and a non-adhesive base, supplying a liquid synthetic resin for cantilevers to a thickness corresponding to the thickness of the microcantilever to an upper surface of the base block and curing the liquid synthetic resin for cantilevers via a boundary between the adhesive base and the non-adhesive base, wherein the adhesive base has stronger adhesivity to the cured synthetic resin for cantilevers than the non-adhesive base.

The expression "supplying a liquid synthetic resin for cantilevers to a thickness corresponding to the thickness of the microcantilever" means that a liquid synthetic resin layer for cantilevers supplied to the upper surface of the base block corresponds to the thickness of the microcantilever formed after curing. Unless the thickness of the layer is changed during curing, the thickness of the layer may be the same as the thickness of the final microcantilever, and if the thickness of the layer is changed, the thickness of the layer may increase or decrease as much as the thickness is changed.

The liquid synthetic resin for cantilevers is cured into the desired shape of the microcantilever and the non-adhesive base is removed from the adhesive base, thereby providing a microcantilever having one end adhered to the adhesive base and the other end as a free end. At this time, since the adhesive base has stronger adhesivity to the synthetic resin for cantilevers than the non-adhesive base, only the non-adhesive base can be easily detached from the microcantilever.

Conventional methods provide production of microcantilevers with harder materials than synthetic resins such as silicon, silicon nitride and silicon oxide, while the present invention provides production of microcantilevers with soft materials such as synthetic resins. Accordingly, the problem in which sensitive actions of sensors are difficult due to operation by limited force can be overcome by cantilevers using soft synthetic resins.

In addition, the non-adhesive base may be a material not adhered to the cured synthetic resin for cantilevers. Specifically, the non-adhesive base contains polydimethylsiloxane (PDMS), and the synthetic resin for cantilevers contains polyethylene glycol diacrylate (PEGDA), so that the microcantilever formed by curing the liquid synthetic resin for cantilevers is readily adhered to an upper surface of the adhesive base, but is not adhered to an upper surface of the non-adhesive base. This is because an oxygen layer present on the upper surface of the non-adhesive base having high oxygen transmittance inhibits polymerization of the synthetic resin for cantilevers. Accordingly, in the process of removing the non-adhesive base from the adhesive base, the non-adhesive base can be easily detached from the cured synthetic resin for cantilevers.

Meanwhile, the supplying the liquid synthetic resin for cantilevers to a thickness corresponding to the thickness of the microcantilever may include injecting the liquid synthetic resin for cantilevers between the base block and the cover block spaced apart from each other by a gap corresponding to the thickness of the microcantilever.

In addition, there are a variety of methods of injecting the liquid synthetic resin for cantilevers into the gap between the base block and the cover block. For example, the liquid synthetic resin for cantilevers may be directly injected therebetween using a syringe or nozzle inserted into the gap, or may be injected by applying a high pressure thereto while immersing the same in the liquid synthetic resin. In addition, preferably, the liquid synthetic resin for cantilevers is injected between the base block and the cover block based on a capillary phenomenon by separating the base block from the cover block after adhering the upper surface of the base block to the cover block. In this case, the gap between the base block and the cover block may correspond to the thickness of the microcantilever and a process of injecting the liquid synthetic resin for cantilevers into very narrow gaps using the capillary phenomenon is possible and production of very thin microcantilevers is thus possible.

In addition, the microcantilever is cured under the condition that an upper surface thereof is adhered to a flat lower surface of the cover block and the microcantilever thus has a flat upper surface. This provides environments useful for forming coatings or other elements on microcantilevers, and microcantilevers that have a uniform shape and thus improved applicability as sensors.

For example, in the process of curing the liquid synthetic resin for cantilevers, a tip protruding from the surface of the microcantilever can be formed using a mask controlling exposure of light for curing the liquid synthetic resin for cantilevers, and a dynamic grayscale mask capable of controlling an amount of exposed light, for example, inducing exposure of a greater amount of light to the center of the tip than the circumference thereof can be selected.

In particular, preferably, the mask controls an amount of light exposed to the liquid synthetic resin for cantilevers according to a height of the tip. A mask transmitting a greater amount of light as the height of the tip increases can be selected.

In addition, a molding method may be selected in addition to a method using a mask. Specifically, the liquid synthetic resin for cantilevers is injected between the base block and the cover block spaced apart from each other by a gap corresponding to the thickness of the microcantilever, wherein a tip corresponding to a reverse portion is formed on the surface of the microcantilever using the cover block having the reverse portion with a recess shape on an end thereof exposed to the liquid synthetic resin for cantilevers.

In addition, preferably, the cover block is a material not adhered to the synthetic resin for cantilevers. This is because the cured liquid synthetic resin for cantilevers is easily detached from the cover block. For example, the cover block may contain polydimethylsiloxane, and the synthetic resin for cantilevers may contain polyethylene glycol acrylate, so that the microcantilever formed by curing the liquid synthetic resin for cantilevers is not adhered to the cover block.

The adhesive base may be glass well adhered to the cured synthetic resin for cantilevers.

For reference, the curing the liquid synthetic resin for cantilevers via the boundary between the adhesive base and the non-adhesive base may include incorporating a photocuring agent in the synthetic resin for cantilevers and emitting UV light or light with a certain wavelength to the synthetic resin for cantilevers. Photolithography enabling microcantilevers to be patterned with a certain wavelength of light has already been developed to a nano-scale and more accurate microcantilevers having a designed shape can thus be produced by photolithography.

In addition, the base block may be formed by curing the synthetic resin while immersing the adhesive base in a synthetic resin for the non-adhesive base, and cutting the synthetic resin cured so as to expose the upper surface of the adhesive base.

In addition, in accordance with another aspect of the present invention, there is provided a microcantilever block including a base block having an adhesive base and a non-adhesive base, and a microcantilever formed by curing a liquid synthetic resin for cantilevers disposed on an upper surface of the base block such that the liquid synthetic resin passes through a boundary between the adhesive base and the non-adhesive base, wherein the adhesive base has stronger adhesivity to the cured synthetic resin for cantilevers than the non-adhesive base. Next, the non-adhesive base may be removed to adhere an end of the microcantilever to the adhesive base and provide the other end of the microcantilever as a free end.

In addition, preferably, the non-adhesive base is not adhered to the cured synthetic resin for cantilevers.

In addition, the microcantilever is formed by injecting the synthetic resin between the base block and the cover block spaced apart from each other by a gap corresponding to the thickness of the microcantilever, and curing the synthetic resin. In this case, preferably, the cover block is not adhered to the cured synthetic resin for cantilevers.

In addition, in accordance with another aspect of the present invention, there is provided a base block for mounting a microcantilever having a predetermined thickness. The base block may include an adhesive base and a non-adhesive base receiving a liquid synthetic resin for cantilevers for obtaining the microcantilevers on an upper surface thereof, and the microcantilever formed by curing the liquid synthetic resin for cantilevers disposed such that the liquid synthetic resin passes through the boundary between the adhesive base and the non-adhesive base has stronger adhesivity to the adhesive base than the non-adhesive base.

In addition, in accordance with another aspect of the present invention, there is provided an apparatus for manufacturing a microcantilever including an accommodation chamber for accommodating a liquid synthetic resin for cantilevers for obtaining the microcantilevers, and a stage on which a base block having an adhesive base and a non-adhesive base is mounted, the stage moving in the accommodation chamber, wherein the liquid synthetic resin for cantilevers is supplied to a thickness corresponding to the thickness of the microcantilever to an upper surface of the base block by moving the stage, and the liquid synthetic resin for cantilevers is cured while the liquid synthetic resin passes through a boundary between the adhesive base and the non-adhesive base, to impart stronger adhesivity to the adhesive base than the non-adhesive base.

Advantageous Effects

Conventional methods provide production of microcantilevers with harder materials such as silicon, silicon nitride and silicon oxide, while microcantilevers obtained by the manufacturing method of the present invention exhibit sensitive actions as sensors because they are produced with soft materials such as synthetic resins.

In addition, the synthetic resin for cantilevers is patterned by photolithography, that is, a method using light, thereby providing microcantilevers with more accurately designed shapes by photolithography involving patterning technologies developed to a nano-scale.

In addition, the gap between the base block and the cover block may correspond to the thickness of the microcantilever. Accordingly, production of very thin microcantilevers is possible.

In addition, the microcantilever is cured under the condition that an upper surface thereof is adhered to a flat lower surface of the cover block, thereby imparting a flat upper surface to the microcantilever.

This also provides environments useful for forming coatings or other elements on microcantilevers and microcantilevers that have a uniform shape and thus improved utilization values as sensors.

In addition, the microcantilever is formed over the adhesive base that is easily adhered to the synthetic resin for cantilevers and the non-adhesive base that is difficult to adhere thereto, so a subsequent process of detaching the non-adhesive base is easy.

In addition, by using a cover block that is difficult to adhere to the cured synthetic resin for cantilevers, a process of detaching the cover glass from the microcantilever is easy after patterning the microcantilever.

In addition, a plurality of adhesive bases are disposed on the non-adhesive base and the synthetic resin for cantilevers is optically cured, thereby simultaneously mass-producing a plurality of microcantilevers.

DESCRIPTION OF DRAWINGS

The above and other objects, features and other advantages of the present invention will be more clearly understood from the following detailed description taken in conjunction with the accompanying drawings, in which:

FIG. 1 illustrates a 3-axis microstage and a dynamic mask lithography apparatus for manufacturing a microcantilever according to a manufacturing method of a microcantilever of the present invention;

FIG. 2 illustrates a status in which a stage having a base block mounted thereon is moved in an accommodation chamber, the base block is adhered to a lower surface of a cover block and a liquid synthetic resin for cantilevers is charged into the accommodation chamber;

FIG. 3 illustrates a status in which the synthetic resin for cantilevers is injected between upper surfaces of the adhesive base and the non-adhesive base, and a lower surface of the cover block using a capillary phenomenon by moving the stage downward;

FIG. 4 illustrates a microcantilever formed via the adhesive base and the non-adhesive base by lithography;

FIG. 5 illustrates a microcantilever having an end adhered to the adhesive base formed by removing the non-adhesive base;

FIG. 6 is a perspective view illustrating a process for simultaneously mass-producing microcantilevers by disposing a plurality of base blocks on the non-adhesive base and optically curing the synthetic resin for cantilevers;

FIG. 7 are images of a rectangular microcantilever and a v-shaped microcantilever manufactured at different sizes using polydimethylsiloxane;

FIG. 8 shows images of V-shaped microcantilevers having different thicknesses;

FIG. 9 is a view of a mask for forming a tip on the surface of the microcantilever according to the present invention;

FIG. 10 is a view of a microcantilever block having the tip formed on the microcantilever by the mask shown in FIG. 9; and FIG. 11 is a view illustrating a process of forming a tip using a cover block on the surface of the microcantilever according to the present invention.

BEST MODE

Hereinafter, preferred embodiments of the present invention will be described in detail with reference to the annexed drawings, but should be not construed as limiting or restricting the scope of the present invention. In the drawings, the same reference numbers will be used throughout the drawings to refer to substantially same elements. Contents described in other drawings may be cited for a more thorough description under such a condition and contents that may be determined obvious to those skilled in the art or repeated contents may be omitted.

FIG. 1 illustrates a 3-axis microstage and a dynamic mask lithography apparatus for manufacturing a microcantilever according to a manufacturing method of a microcantilever of the present invention, FIG. 2 illustrates a status in which a stage having a base block mounted thereon is moved in an accommodation chamber, the base block is adhered to a lower surface of a cover block and a liquid synthetic resin for cantilevers is charged into the accommodation chamber, FIG. 3 illustrates a status in which the synthetic resin for cantilevers is injected between upper surfaces of the adhesive base and the non-adhesive base and a lower surface of the cover block using a capillary phenomenon by moving the stage downward, FIG. 4 illustrates a microcantilever formed via the adhesive base and the non-adhesive base by lithography, and FIG. 5 illustrates a microcantilever having an end adhered to the adhesive base formed by removing the non-adhesive base.

The synthetic resin for cantilevers used for the manufacturing method of a microcantilever according to the present invention includes polyethylene glycol acrylate (Mw=250, 575; Sigma Aldrich) that belongs to hydrogel.

In addition to the material described above, the synthetic resin for cantilevers may include any one of an acrylonitrile butadiene styrene (ABS) resin, polymethylmethacrylate (PMMA), polyimide, polyacrylate, polyurethane, polyhydroxyethyl methacrylate (PHEMA), polyvinyl alcohol, polyvinyl pyrrolidone, and acryloylacetone/acrylamide/N,N-methylene bisacrylamide (MBAAm).

In addition, in the present embodiment, a photoinitiator (UV curing agent) is added to polyethylene glycol acrylate in a weight ratio of 1:99. The photoinitiator used herein may be phenylbis(2,4,6-trimethylbenzoyl), or phosphine oxide (Sigma Aldrich). In addition, a mixture of polyethylene glycol acrylate and the photoinitiator is stirred for 24 hours.

FIG. 1 illustrates an apparatus for manufacturing a microcantilever based on a dynamic mask lithography and a 3-axis microstage.

A base block 110 is placed on a stage 102. First, a method for manufacturing the base block 110 will be described in brief.

The base block 110 includes an adhesive base 112 and a non-adhesive base 114. Preferably, the adhesive base 112 and the non-adhesive base 114 share one upper surface and the upper surface of the base block 110 is flat because the microcantilever is loaded on the upper surface of the base block 110 in the subsequent process. Specifically, a piece of cut glass slice that can be used as the adhesive base 112 is placed on a Petri dish, and the dish is filled with polydimethylsiloxane for the non-adhesive base 114. Next, this substance is cured and the non-adhesive base 114 is cut into the shape as designed such that upper surfaces of the adhesive base 112 and the non-adhesive base 114 form one flat surface, as described above.

As shown in FIG. 2, the base block 110 thus formed is mounted on the 3-axis microstage 102 and is disposed on an empty accommodation chamber 140. In addition, the accommodation chamber 140 is covered with a cover block 120. Next, the base block 110 is vertically moved from the stage 102 such that it smoothly contacts the cover block 120 and the prepared liquid synthetic resin 130 for cantilevers is charged into the accommodation chamber 140.

Next, as shown in FIG. 3, immediately after the base block 110 is separated from the cover block 120 by a predetermined gap, the synthetic resin 130 for cantilevers is moved to fill the gap between the base block 110 and the cover block 120 by capillary force. The separation gap finally determines the thickness of the microcantilever 100.

In the present embodiment, the synthetic resin for cantilevers is supplied into the gap between the base block and the cover block by capillary phenomenon. In some cases, the synthetic resin for cantilevers may be directly printed on or applied to the base block. In addition, a method of separating the base block from the bottom of the accommodation chamber filled with the synthetic resin for cantilevers (in this case, the bottom of the accommodation chamber may correspond to the cover block) may be selected. In any case, the gap between the base block and the cover block may correspond to the thickness of the microcantilever.

Next, as shown in FIG. 4, the microcantilever 100 is cross-linked via the boundary between the adhesive base 112 and the non-adhesive base 114 of the base block 110 to have a desired shape and size using dynamic mask lithography generated by a beam projector 104 (Canon, REALiS SX50) and a 405 nm wavelength ($\lambda$) UV light-emitting diode 106 (Innovations in Optics, 2600N-700-14-B1-N-N). In addition to the method suggested in the present embodiment, any well-known technique may be widely utilized in the lithography process so long as the liquid synthetic resin 130 for cantilevers can be cured into of the microcantilever. For reference, in the present embodiment, exposure intensity and time of light are 0.15 mW/cm$^2$ and 2 to 5 seconds.

Meanwhile, the non-adhesive base 114 supplied as polydimethylsiloxane is a material widely used for molding since it is not readily adhered to other synthetic resins. This is because an oxygen layer near the non-adhesive base 114 inhibits polymerization of the synthetic resin 130 for cantilevers.

For reference, the liquid synthetic resin for cantilevers, that is, hydrogel, is adhered to the surface of glass or metal when cured, while it is not adhered to PDMS. This is because PDMS is an oxygen-transmitting substance that always has a thin oxygen inhibition layer on the surface thereof. For this reason, when the hydrogel cantilever is cured in the base block made using glass and PDMS, a portion of the cantilever corresponding to the adhesive base is adhered to glass, while a free end portion of the cantilever is very easily detached from the PDMS.

In addition, whether or not the hydrogel is adhesive upon curing is important in manufacture of the cover block. The cover block basically should transmit light. Glass should be surface-treated for use as a cover block. In this case, PDMS should be cured by spin coating for use as the cover block. PDMS is used for surface-treatment because hydrogel is not adhered thereto. Both of the two substances are suitable for such use because they have superior light-transmittance. Alternatively, PDMS having a predetermined pattern and a great thickness may be easily used as the cover block.

Accordingly, the microcantilever 100 is adhered to the upper surface of the adhesive base 112, while a protrusion (referred to as "a free end" later) thereof is smoothly placed on the non-adhesive base 114, without being adhered thereto. Accordingly, the synthetic resin 130 for cantilevers is cured to form the microcantilever 100 and the non-adhesive base 114 is easily detached from the adhesive base 112. For reference, a CCD camera 108 is connected to PC and a monitor to monitor the manufacturing process. For reference, an LED is used as the beam projector, the emitted light passes through a beam splitter and cures the synthetic resin 130 for cantilevers, and an LCOS chip refers to a liquid crystal on silicon (LCOS) used for a display device.

In the present embodiment, the beam splitter is used for a microcantilever with a certain shape and a mask capable of transmitting light to correspond to the designed shape of the microcantilever may be used as well.

After the microcantilever 100 is cross-linked via the adhesive base 112 and the non-adhesive base 114, the synthetic resin 130 for cantilevers not exposed to light near the microcantilever 100 is washed with isopropyl alcohol (IPA) and water and is then dried at room temperature.

The dried microcantilever 100 may be further exposed to ultraviolet light for 1 to 2 minutes for more thorough cross-linkage.

In addition, the cover block 120 includes a cover glass 122 and a cover synthetic resin 124 for accommodating the cover glass 122. The cover synthetic resin 124 contains polydimethylsiloxane. During curing of the synthetic resin 130 for cantilevers, an oxygen layer present on a lower surface of the cover synthetic resin 124 inhibits polymerization of the synthetic resin 130 for cantilevers, so that the microcantilever 100 is not adhered to the lower surface of the cover synthetic resin 124. Accordingly, a process of detaching the cover block 120 from the microcantilever 100 after patterning of the microcantilever 100 is easy.

Meanwhile, the microcantilever 100 can be easily taken out of the base block 110 by cutting the non-adhesive base 114 with a cutter, which is shown in FIG. 5. An end of the microcantilever 100 is fixed in the form of a cantilever on the adhesive base 112, thereby providing a cantilever block having the adhesive base 112 and the microcantilever 100, which can be used as various sensors.

In particular, the upper surface of the microcantilever 100 may be formed to correspond to the lower surface of the cover block 120. In particular, since the surface of the microcantilever 100 can be easily formed flatly, tips for biosensors that respond to certain proteins and antigens, tips that respond to magnetism and the like can be easily loaded thereon.

FIG. 7 shows images of rectangular microcantilevers (FIG. 7A) and v-shaped microcantilevers (FIG. 7B) manufactured at different sizes using polydimethylsiloxane. The standards (length×width) of the rectangular cantilever are 100 μm×20 μm, 240 μm×35 μm, and 470 μm×70 μm, the standards (length×width) of the v-shaped cantilever are 120 μm×120 μm, 260 μm×250 μm, and 520 μm×500 μm, and each microcantilever has a thickness of 30 μm.

As described above, the thickness of the microcantilever is controlled by the gap between the cover block coated with polydimethylsiloxane and the base block.

FIG. 8 shows images of V-shaped microcantilevers that have similar surface size, but different thicknesses (30, 60, and 90 μm). FIG. 8A is a front view and FIG. 8B is a side view.

The present invention is directed to a method for manufacturing microcantilevers having very accurately controlled size, shape and thickness by dynamic mask photolithography, which may be applied to manufacture all hydrogel microcantilevers. The microcantilevers can be used as very sensitive flat forms according to hydrogel microstructures.

In addition, in the present embodiment, an exemplary method of providing a microcantilever onto one base block is described. However, referring to FIG. 6, a plurality of base blocks 212 corresponding to the number as designed are placed on the non-adhesive base 214 and the synthetic resin for cantilevers is optically cured to simultaneously manufacture a large number of microcantilevers 200.

Specifically, the liquid synthetic resin for cantilevers is cured into the designed shape of the microcantilever, and the non-adhesive base 214 is bent or divided into two along a cutting line 216 to simultaneously mass-produce the microcantilever 200 having one end serving as a free portion and the other end serving as a fixing portion fixed to the adhesive base 212. That is, it is possible to manufacture a plurality of microcantilever blocks, each including a base block and a microcantilever having one end adhered to an end of the base block and the other end as a free portion.

In addition, FIG. 9 is a view of a mask for forming a tip on the surface of the microcantilever according to the present invention and FIG. 10 is a view of a microcantilever block having the tip formed on the microcantilever by the mask shown in FIG. 9.

FIG. 9 illustrates a mask 150 having exposure of light changed according to region. Specifically, region A has higher light transmittance than region B.

Accordingly, light emitted to the liquid synthetic resin for cantilevers through the mask 150 cures the liquid synthetic resin for cantilevers, but as shown in FIG. 10, the center of a tip 301 corresponding to the region A of the mask 150 is exposed to more light than the circumference of the tip 301 corresponding to the region B of the mask 150, thereby forming the tip 301 having a quadrangular pyramid shape on the upper surface of the microcantilever 300 in the washing process after curing.

The microcantilever 300 placed on the adhesive base 312 and the tip 301 formed on the microcantilever 300 may be simultaneously obtained during curing of the liquid synthetic resin for cantilevers, or the microcantilever may be first formed and the top may then be formed.

In addition, the mask may affect an amount of light to which the liquid synthetic resin for cantilevers is exposed according to height of the tip, which depends on addition of a positive or negative photoinitiator as a curing agent to the liquid synthetic resin. When the positive photoinitiator is added, a mask that is capable of increasing an amount of exposure light as the tip height increases can be used.

FIG. 11 is a view illustrating a process of forming a tip using a cover block on the surface of the microcantilever according to the present invention.

Referring to FIG. 11, the tip may be formed on the microcantilever by a method using molding, in addition to the method using a mask.

The base block 110, the 3-axis microstage 102 and the accommodation chamber 140 illustrated in FIG. 11 are described as in FIG. 3 and are designated by same reference numerals. Otherwise, the following description will be given based on the cover block 160 because the cover block 160 illustrated in FIG. 11 is slightly different from the cover block 120 illustrated in FIG. 3.

First, the liquid synthetic resin 130 for cantilevers is injected between the base block 110 and the cover block 160 spaced by a gap corresponding to the thickness of the microcantilever.

At this time, a reverse portion 162 having a recess shape is formed on a surface of the cover block 170 exposed to the liquid synthetic resin 130 for cantilevers and a tip may be formed on the surface of the microcantilever, to correspond thereto.

Since the cover block 160 transmits light, the microcantilever can be formed to have a desired shape and size by cross-linking the liquid synthetic resin for cantilevers along the boundary between the adhesive base 112 and the non-adhesive base 114 using the beam projector described above, and the tip can be formed on the surface of the microcantilever so as to have a shape corresponding to the shape of the reverse portion 162.

The microcantilever and tip may be simultaneously formed in the process of curing the liquid synthetic resin for cantilevers. Alternatively, the microcantilever may be first formed and the tip may then be formed.

For reference, the cover block 160 can be readily detached from the cured synthetic resin for cantilevers because it is produced from polydimethylsiloxane.

In addition, to form the cover block described above, first, a silicon wafer is oxidized to form a 500 nm silicon oxide layer over the wafer and the silicon oxide layer is then patterned using a photolithography process. The patterned layer is dry-etched to remove only the patterned silicon oxide. Then, the wafer is immersed in KOH and anisotropic etching is performed to form a pyramidal structure. The resulting wafer is surface-treated with silane and a mold having a protrusion is made with PDMS. The mold thus made is surface-treated with silane and a pyramidal mold having a recess is made with PDMS. The pyramidal mold having a recess thus made may be used as the cover block which is arrayed well on the base block to manufacture a cantilever having a tip.

Although the present invention has been disclosed with reference to the preferred embodiments, those skilled in the art will appreciate that various modifications, additions and substitutions are possible, without departing from the scope and spirit of the invention as disclosed in the accompanying claims.

INDUSTRIAL APPLICABILITY

The microcantilever according to the present invention may be widely applied to sensors that are capable of sensitively responding to slight stress or force or temperatures.

The invention claimed is:

1. A method for manufacturing a microcantilever having a predetermined thickness comprising:
    providing a base block having an adhesive base and a non-adhesive base, wherein the adhesive base and the non-adhesive base have a common upper surface;
    supplying a liquid synthetic resin to a thickness corresponding to the thickness of the microcantilever to the common upper surface of the base block;
    curing the liquid synthetic resin via a boundary between the adhesive base and the non-adhesive base; and
    detaching the non-adhesive base from the adhesive base and the cured synthetic resin,
    wherein the adhesive base has stronger adhesion to the cured synthetic resin than the non-adhesive base.

2. The method according to claim 1, wherein the liquid synthetic resin is supplied on all of the common upper surface of the base block.

3. The method according to claim 2, wherein the non-adhesive base comprises polydimethylsiloxane,
    the liquid synthetic resin comprises polyethylene-glycol diacrylate, and
    the microcantilever formed by curing the liquid synthetic resin is adhered to an upper surface of the adhesive base, but is not adhered to an upper surface of the non-adhesive base.

4. The method according to claim 1, wherein the supplying the liquid synthetic resin to a thickness corresponding to the thickness of the microcantilever comprises injecting the liquid synthetic resin between the base block and a cover block spaced apart from each other by a gap corresponding to the thickness of the microcantilever.

5. The method according to claim 4, wherein the liquid synthetic resin is injected between the base block and the cover block by a capillary phenomenon by separating the base block from the cover block after adhering the upper surface of the base block to the cover block.

6. The method according to claim 4, wherein the cover block comprises a material not adhered to the cured synthetic resin.

7. The method according to claim 6, wherein the cover block comprises polydimethylsiloxane,
the liquid synthetic resin comprises polyethylene-glycol diacrylate, and
the microcantilever formed by curing the liquid synthetic resin is not adhered to the cover block.

8. The method according to claim 1, wherein the adhesive base comprises glass.

9. The method according to claim 1, further comprising removing the non-adhesive base to adhere an end of the microcantilever to the adhesive base and provide the other end of the microcantilever as a free end, after the curing the liquid synthetic resin via the boundary between the adhesive base and the non-adhesive base.

10. The method according to claim 1, wherein the liquid synthetic resin comprises a photocuring agent, and
the curing of the liquid synthetic resin is carried out by emitting light to the liquid synthetic resin.

11. The method according to claim 1, wherein the base block is formed by curing the synthetic resin while immersing the adhesive base in a synthetic resin for the non-adhesive base, and cutting the synthetic resin cured to expose the upper surface of the adhesive base.

12. The method according to claim 1, wherein a plurality of adhesive bases including the adhesive base are disposed on the non-adhesive base to simultaneously form a plurality of microcantilevers including the microcantilever.

13. The method according to claim 1, wherein the curing of the liquid synthetic resin comprises forming a tip protruding from a surface of the microcantilever using a mask controlling exposure of light for curing the liquid synthetic resin.

14. The method according to claim 13, wherein the mask controls an amount of light exposed to the liquid synthetic resin according to a height of the tip.

15. The method according to claim 1, wherein the liquid synthetic resin is injected between the base block and a cover block spaced apart from each other by the gap corresponding to the thickness of the microcantilever,
wherein a tip corresponding to a reverse portion is formed on the surface of the microcantilever using the cover block having the reverse portion having a recess shape on an end thereof exposed to the liquid synthetic resin.

16. The method according to claim 1, wherein the liquid synthetic resin comprises any one of an acrylonitrile butadiene styrene (ABS) resin, polymethylmethacrylate (PMMA), polyimide, polyacrylate, polyurethane, polyhydroxyethyl methacrylate (PHEMA), polyvinyl alcohol, polyvinyl pyrrolidone, and acryloylacetone/acrylamide/N,N'-methylene bisacrylamide (MBAAm).

17. An apparatus for manufacturing a microcantilever comprising:
an accommodation chamber for accommodating a liquid synthetic resin for the microcantilever; and
a stage on which a base block having an adhesive base and a non-adhesive base is mounted, the stage moving in the accommodation chamber,
wherein the liquid synthetic resin is supplied to a thickness corresponding to the thickness of the microcantilever to an upper surface of the base block by moving the stage, and the liquid synthetic resin is then cured via a boundary between the adhesive base and the non-adhesive base, to impart stronger adhesion to the adhesive base than the non-adhesive base.

18. The apparatus according to claim 17, further comprising a cover block having an end contacting the liquid synthetic resin,
wherein the liquid synthetic resin is injected between the base block and the cover block by separating the stage after adhering the stage to the end of the cover block.

19. The apparatus according to claim 18, wherein the liquid synthetic resin is injected between the base block and the cover block spaced apart from each other by a gap corresponding to the thickness of the microcantilever,
wherein a tip corresponding to a reverse portion is formed on the surface of the microcantilever using the cover block having the reverse portion with a recess shape on an end thereof exposed to the liquid synthetic resin.

20. The apparatus according to claim 17, further comprising a mask controlling exposure of light for curing the liquid synthetic resin to form a tip protruding from the surface of the microcantilever.

21. The apparatus according to claim 20, wherein the mask controls an amount of light exposed to the liquid synthetic resin according to a height of the tip.

* * * * *